US006515751B1

United States Patent
Craighead et al.

(10) Patent No.: US 6,515,751 B1
(45) Date of Patent: Feb. 4, 2003

(54) MECHANICALLY RESONANT NANOSTRUCTURES

(75) Inventors: Harold G. Craighead, Ithaca, NY (US); Dustin W. Carr, Pittstown, NJ (US); Lidija Sekaric, Ithaca, NY (US)

(73) Assignee: Cornell Research Foundation Inc., Ithaca, NY (US)

( * ) Notice: Subject to any disclaimer, the term of this patent is extended or adjusted under 35 U.S.C. 154(b) by 0 days.

(21) Appl. No.: 09/520,984

(22) Filed: Mar. 8, 2000

Related U.S. Application Data

(60) Provisional application No. 60/123,842, filed on Mar. 11, 1999.

(51) Int. Cl.$^7$ ................................................. G01B 9/02

(52) U.S. Cl. ...................................... 356/519; 356/498

(58) Field of Search .............................. 356/498, 496, 356/450, 515; 73/655, 657; 257/431

(56) References Cited

U.S. PATENT DOCUMENTS

| | | | |
|---|---|---|---|
| 4,437,226 A | 3/1984 | Soclof | |
| 4,522,682 A | 6/1985 | Soclof | |
| 4,679,301 A | 7/1987 | Blanchard et al. | |
| 4,845,048 A | 7/1989 | Tamaki et al. | |
| 5,156,988 A | 10/1992 | Mori et al. | |
| 5,368,684 A | 11/1994 | Ishikawa et al. | |
| 5,426,070 A | 6/1995 | Shaw et al. | |
| 5,559,358 A | * 9/1996 | Burns et al. ................. | 257/431 |

FOREIGN PATENT DOCUMENTS

| | | |
|---|---|---|
| DE | 4000498 | 2/1991 |
| JP | 58089859 | 5/1983 |

OTHER PUBLICATIONS

A.N. Cleland and M.L. Roukes, Fabrication of high frequency nanometer scale mechanical resonators from bulk Si crystals, *Appl. Phys. Lett.* 69(18), (1996), pp. 2653–2655.

Frederick T. Chen and Harold G. Craighead, Diffractive lens fabricated with mostly zeroth–order gratings, *Optics Letters* vol. 21, No. 3, (1996) pp. 177–179.

Michael R. Houston, Roya Maboudian, and Roger T. Howe, Ammonium Fluoride Anti–Stiction Treatments for Polysilicon Microstructures, *Transducers '95—Eurosensors IX*.

(List continued on next page.)

Primary Examiner—Samuel A. Turner
Assistant Examiner—Patrick Connolly
(74) Attorney, Agent, or Firm—Jones, Tullar & Cooper, P.C.

(57) ABSTRACT

Electron beam lithography is used to make very small mechanical structures in single-crystal silicon. The structure may be a mesh having beam widths of less than 30 nm and suspended in a wafer, above a substrate. An rf drive voltage applied between the suspended structure and the underlying substrate produces vibration at or near the resonant frequency of the structure, and optical interference techniques are used to detect and measure the motion of the structure. The small dimensions of the structure provides a resonant frequency above 40 MHz. In one embodiment, the structure is a mesh formed of interconnected, very narrow, high aspect ratio parallel beams spaced about 315 nm apart. This results in a nanostructure having a low mass and a large relative surface area. The mesh is illuminated by laser light having a wavelength greater than the spacing between adjacent beams in the mesh so that small amplitude oscillations can be measured, with the detected change in optical reflection being proportional to the drive amplitude. The suboptical-wavelength features of the mesh provide a high measurement sensitivity, so that small changes in the mechanical properties of the mesh, resulting in corresponding small changes in the amplitude of the vibration, can be detected. A variable DC bias voltage applied to the vibrating structure allows adjustment of the motion of the structure and tuning of its vibration.

16 Claims, 5 Drawing Sheets

OTHER PUBLICATIONS

D.W. Carr and H.G. Craighead, Fabrication of nanoelectromechanical systems in single crystal silicon using silicon on insulator substrates and electron beam lithography, *J. Vac. Sci. Technol. B* 15(6), (1997), pp. 2760–2763.

W.R. Wiszniewski, R.E. Collins and B.A. Pailthorpe, Mechanical light modulator fabricated on a silicon chip using SIMOX technology, *Sensors an Actuators A*, 43 (1994) pp. 170–174.

James A. Walker, Keith W. Goossen, and Susanne C. Arney, Fabrication of a Mechanical Antireflection Switch for Fiber-to-the-Home Systems, *Journal of Microelectromechanical Systems*, vol. 5, No. 1, (1996) pp. 45–51.

R. E. Mihailovich and J. M. Parpia, Low Temperature Mechanical Properties of Boron–Doped Silicon, *Physical Review Letters*, vol. 68, No. 20, 18 (1992) pp. 3052–3055.

Terry V. Roszhart, The Effect of Thermoelastic Internal Friction of the Q of Micromachined Silicon Resonators, *IEEE Solid State Sensor and Actuator Workshop 13* (1990) pp. 13–16.

R.E. Mihailovich and N.C. MacDonald, Dissipation measurements of vacuum–operated single–crystal silicon microresonators, *Sensors and Actuators A 50* (1995) pp. 199–207.

Göran Stemme, Resonant silicon sensors, *J. Micromech. Microeng.* 1 (1991) pp. 113–125.

Susanne C. Arney and Noel C. MacDonald, Formation of submicron silicon–on–insulator structures by lateral oxidation of substrate–silicon islands, *J. Vac. Sci. Technol.* B6(1), Jan./Feb. 1988, pp. 341–345.

M. Kubota, T. Tamaki, K. Kawakita, N. Nomura and T. Takemoto, New SOI CMOS Process with Selective Oxidation, *IEDM 86*, pp. 814–816.

Digh Hisamoto, Toru Kaga, Yoshifumi Kawamoto & Eiji Takeda; A Fully Depleted Lean–Channel Transistor (DELTA)—A Novel Vertical Ultrathin SOI MOSFET, *IEEE* 1990.

William c. Tang, Tu–Cuong H. Nguyen & Roger T. Howe, Laterally Driven Polysilicon Resonant Microstructures, *Sensors and Actuators 20*, 1989, pp. 25–32.

Harrie A.C. Tilmans, Miko Elwenspoek and Jan H.J. Fluitman, Micro resonant force gauges, *Sensors and Actuators A*, 30 (1992) pp. 35–53.

* cited by examiner-

MECHANICALLY RESONANT NANOSTRUCTURES

This application claims the benefit of Provisional application Ser. No. 60/123,842, filed Mar. 11, 1999.

BACKGROUND OF THE INVENTION

Micromechanical structures are of growing interest for a number of applications in both research and industrial products. For example, it has been found that very small resonant structures are ideally suited to be used as sensors and force gauges. In one application, for example, it has been found that such structures may be used as chemical sensors, wherein a change in the resonant frequency of the structure, as molecules are absorbed into the surface of the structure, can be detected. A large surface area to mass ratio is important to the achievement for high sensitivity in such sensors. Further, it has also been found that high resonant devices can also yield valuable information about the physical properties of materials, and in particular about the sources of internal friction within such materials. Most of the small resonant structures that have previously been used for such purposes were fabricated using known photolithography and chemical etching techniques, and were fabricated with minimum dimensions of 1 micrometer or greater. This limited the resonant frequencies of such devices and limited their usefulness in certain applications.

SUMMARY OF THE INVENTION

The present invention is directed to the fabrication of nanometer-scale mechanical structures in single-crystal silicon or other suitable materials, to the operation of such nanostructures as sensors or force gauges, to the accurate measurement of the motion of such structures, and to the use of the motion of such structures to modulate light at high frequencies. The invention incorporates novel designs that result in nanostructures having decreased mass, to permit higher resonant frequencies than were previously available, while retaining a large surface area to improve the sensitivity of sensors using the structures. The invention also is directed to designs which control the optical properties of nanostructures to facilitate measurements of their motion. The foregoing advantages are obtained through the fabrication of suspended, or released, nanostructures that have spaced, well-defined, sub-wavelength dimensions. In the preferred form of the invention, the nanostructures have generally parallel features such as narrow bars or beams spaced apart by distances of less than the wavelength of the illuminating light used to measure the motion of the structures so as to form, in effect, an optical grating. Interferometric optical techniques can then be used to measure the motion of the structure, using illuminating light from a laser which has a wavelength about twice the distance between adjacent features.

In one form of the invention, a released nanostructure may be in the form of a rectangular mesh which may be used, for example, to explore the mechanical properties of silicon. By observing the shape of the spectrum produced by the vibration of the structure, much can be learned about the nature of energy dissipation in mechanical systems. For example, it has been observed that the attainable quality factors (Q factors) in resonators tend to decrease as the size of the resonator is decreased and the consequent resonant frequency is increased. The nature of the correlation between size and Q-factor can be studied by use of the fabrication techniques and the measurement apparatus of the present invention.

Briefly, the present invention is directed to a method of fabricating and operating resonant nanostructures which includes patterning and etching a silicon-on-insulator (SOI) wafer to fabricate a nanostructure which is suspended over the wafer substrate, and which is electrically isolated from the substrate. The fabrication method allows the structure to be integrated with electronic devices such as conventional CMOS structures on the same SOI substrate. The suspended nanostructure is actuated by applying a high frequency drive voltage between the nanostructure and the substrate to cause the nanostructure to vibrate. This motion can be measured by directing light of a predetermined wavelength onto the nanostructure and detecting variations in, or modulation of, the light reflected from the vibrating nanostructure. The detected light is then supplied to an analyzer to determine the frequency and amplitude of motion of the nanostructure. The nanostructure also can be used simply as a modulator for incident light, as by varying the high frequency drive voltage or by the application of a DC bias voltage, to change the frequency or amplitude of the motion of the nanostructure.

In the preferred form of the invention, the nanostructure is a low mass, high surface area mesh which is suspended by thin wires for motion with respect to the wafer substrate. The mesh preferably is generally rectangular in shape and is made up of regularly-spaced longitudinal features such as narrow beams or bars extending the length of the mesh, and lateral features such as narrow supporting beams or bars spanning its width and intersecting the longitudinal beams to produce multiple generally rectangular apertures through the mesh. The adjacent longitudinal beams are spaced apart by a distance less than the wavelength of incident light to produce a nanostructure in the form of a suboptical wavelength mesh. The incident light preferably is produced by a laser, so that when the nanostructure is vibrated at or near its resonant frequency, and the laser light is directed onto its top surface, the vibration produces changes in the intensity of light reflected from the mesh. The nanostructure is driven so that it vibrates at a low mechanical amplitude to provide a linear relationship between the amplitude of the reflected optical signal and the magnitude of the drive voltage. The suboptical wavelength mesh thus may act, in effect, as an optical grating. The mesh permits interferometric measurement of the motion of the structure while modulating incident light. The low mass and high surface area of the high frequency resonant mechanical structure make it useful not only for exploring the mechanical properties of the material from which the mesh is manufactured, but provides a device which is highly useful as a sensor and as a light modulator. By fabricating the nanostructure on the same substrate as an electronic device, control and measurement of the motion of the device are greatly facilitated.

BRIEF DESCRIPTION OF THE DRAWINGS

The foregoing and additional objects, features and advantages of the present invention will become apparent to those of skill in the art from the following detailed description of a preferred embodiment thereof, taken in conjunction with the accompanying drawings, in which.

DESCRIPTION OF PREFERRED EMBODIMENTS

A fabrication process in accordance with the present invention is illustrated in FIGS. 1–7, to which reference is now made. In the preferred form of the invention, a silicon-on-insulator (SOI) wafer 10 is utilized, the wafer including a thin top layer 12 of single-crystal silicon, which may be between 50 and 200 nm thick, covering a buried oxide layer 14, which may be silicon dioxide approximately 400 nm thick. The oxide layer 14 is on a substrate 16 of (100) silicon. These wafers are commercially available and are fabricated using a bonding and etch-back technique which facilitates very smooth interfaces.

Figure 1:
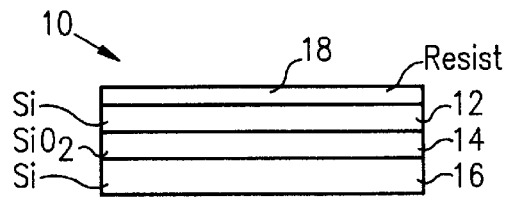
FIGS. 1–7 illustrate a process for fabricating nanostructures in accordance with the present invention.
Figure 2:
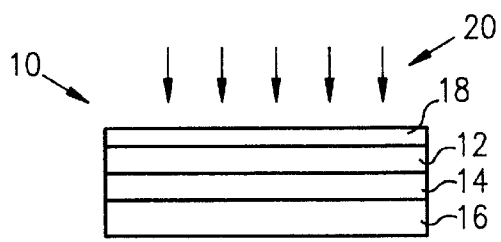
Figure 3:
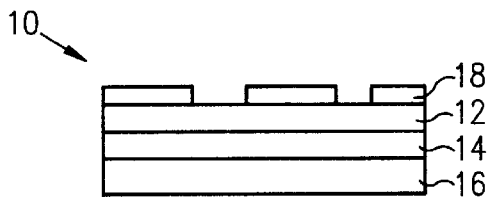
Figure 4:
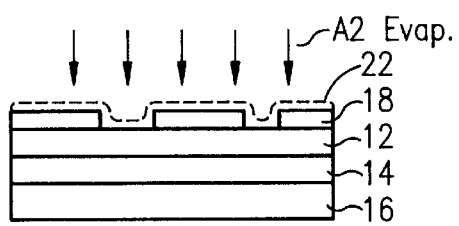
Figure 5:
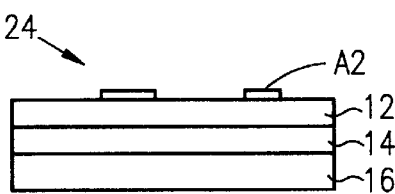
Figure 6:
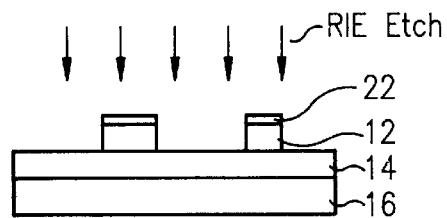
Figure 7:
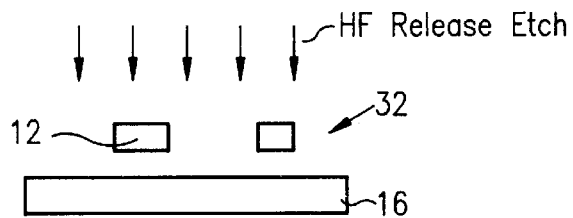

The wafer 10 is covered with a resist layer 18 which is patterned by a high resolution electron beam lithography system, illustrated by arrows 20 in FIG. 2. The pattern is developed, as illustrated in FIG. 3, and a layer 22 of aluminum is evaporated onto the pattern, as illustrated in FIG. 4. This is followed by a conventional aluminum liftoff step, leaving an aluminum pattern mask 24 (FIG. 5), and the top silicon layer 12 is then etched in $CF_4+H_2$ reactive ion etching (RIE) using the aluminum mask, as illustrated in FIG. 6. Thereafter, as illustrated in FIG. 7, an HF oxide etch illustrated by arrow 30 is used to undercut the patterned silicon layer 12 to remove the oxide layer 14 (FIG. 7) and the remaining aluminum mask, leaving a freestanding, or released, structure generally indicated at 32. Thereafter, to make electrical contact to the surface of the released structure 32, a 5 nm layer of chromium and a 10 nm layer of gold are evaporated onto the top surface of structure 32, and contact is made to the surface by wire bonding.

It has been found that an important effect that lowers yield in nanostructures fabricated in accordance with the foregoing process is "stiction", which occurs when the sample wafers are removed from the etching solution during the fabrication process and the surface tension in the liquid tends to pull the suspended structure 32 down to the surface of the wafer substrate 16. This causes the structure 32 to stick to the substrate and effectively destroys the structure. To prevent this from occurring, a critical point drying technique is used in which the wafers are kept in an ethanol solution after the wet oxide etch of FIG. 7. The wafers, while in the solution, are placed in a critical point drying chamber where the ethanol is gradually cycled out and replaced with a liquid $CO_2$ bath. The temperature and pressure in the bath are raised past the critical point where the liquid changes to gas so that drying occurs without destroying the structures.

Figure 8:
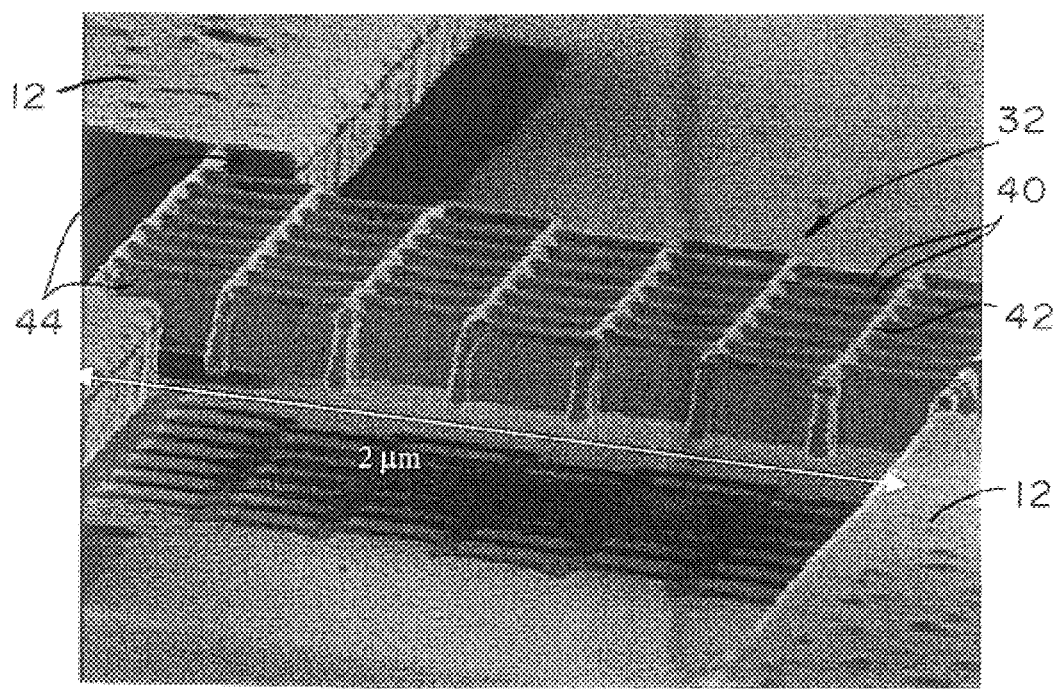
FIG. 8 is a photomicrograph of a suspended mesh nanostructure which is approximately 2 $\mu$m square with a thickness of 50 nm, having a period of 315 nm and a resonant frequency of about 44 MHz.
Figure 9:
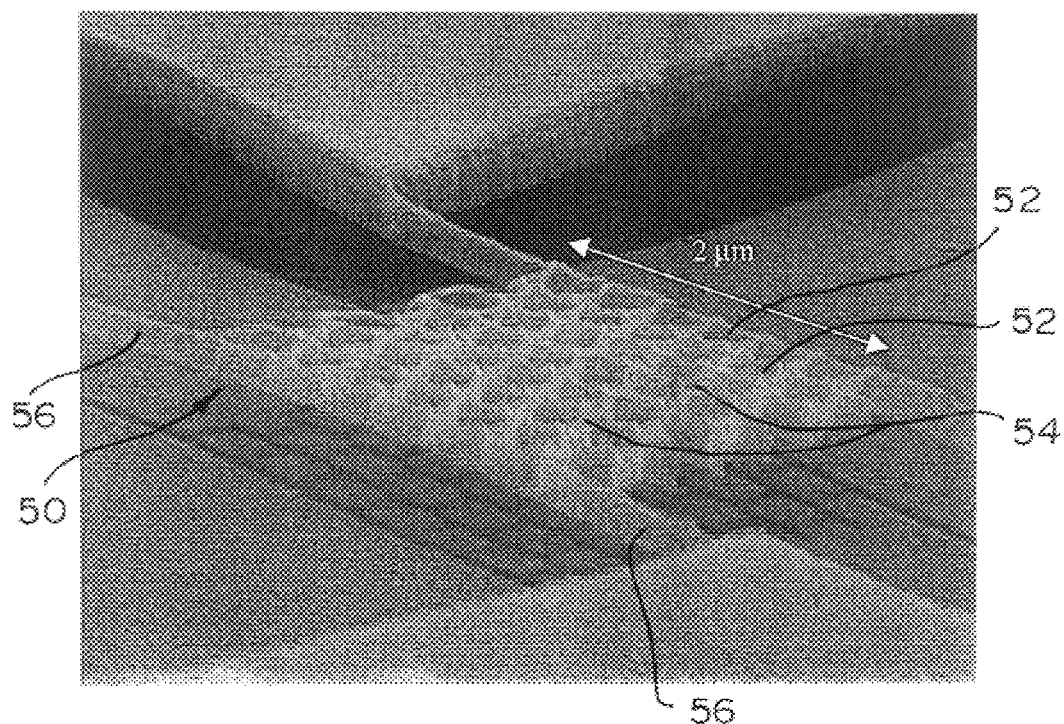
FIG. 9 is a photomicrograph of a suspended mesh structure approximately 2 $\mu$m square with a thickness of 50 nm, having a period of 315 nm and a resonant frequency of about 21 MHz.

Typical structures fabricated in accordance with the foregoing process are illustrated in FIGS. 8 and 9. In FIG. 8, the structure consists of a rectangular mesh which is approximately 2 micrometers in lengths, 2 micrometers in width, and approximately 50 nm in thickness and is connected to the adjacent silicon layer 12 from which it was fabricated. The structure 32 includes a multiplicity of longitudinal beams, or bars, 40 and intersecting lateral support beams, or bars 42. The adjacent longitudinal beams 40 have a center-to-center spacing, or period, of 315 mn so that the suspended mesh 32 and the underlying substrate 16 act as a Fabry-Perot interferometer. The mesh 32 is connected to the surrounding layer 12 by, for example, lateral wires or thin beams such as the beam 44 to permit relative motion of the mesh with respect to the supporting layer. Light from a source such as, for example, an He-Ne laser having a wavelength of 633 nm, is directed onto the surface of the suspended structure 32. When the suspended mesh portion is moved, the light reflected from it changes in intensity. An optical interferometric technique is used detect the motion of the structure from the changes in the light reflected from the surface.

FIG. 9 illustrates a modified form 50 of the suspended nanostructure, wherein the mesh has generally longitudinal beams or bars, illustrated at 52, and has generally lateral beams or bars 54. The longitudinal and lateral bars are spaced approximately equally to provide a mesh having generally square or hexagonal apertures. The adjacent beams or bars are spaced apart to produce a period of about 315 nm in both of the longitudinal and lateral directions. The mesh structure 50 is supported for vertical motion with respect to the underlying substrate by thin beams, or wires 56 connected between the mesh and the surrounding layer 12.

Each of the individual beams or bars, 40, 42 or 52, 54 in FIGS. 8 and 9, respectively, preferably has a relatively high aspect ratio to provide stiffness in a direction perpendicular to the surface of the wafer while allowing motion in a direction parallel with the surface of the wafer. For example, the beams may be approximately 5 nm in width and about 50 nm in depth, to provide an aspect ratio of approximately 10 to 1. The narrow widths of the beams and the relatively large space between adjacent beams results in a very low mass structure. Since this space is about one-half the wavelength of the impinging light, the surface of the structure reflects the light, providing a very large surface-to-mass ratio and permitting highly sensitive measurements of the motion of the structure. The high aspect ratio of the beams which make up the structure, as well as the interconnection of longitudinal and lateral beams, form a rigid honeycomb structure which enables the mesh to move vertically as a solid plate on its supporting thin wires 56.

Figure 10:
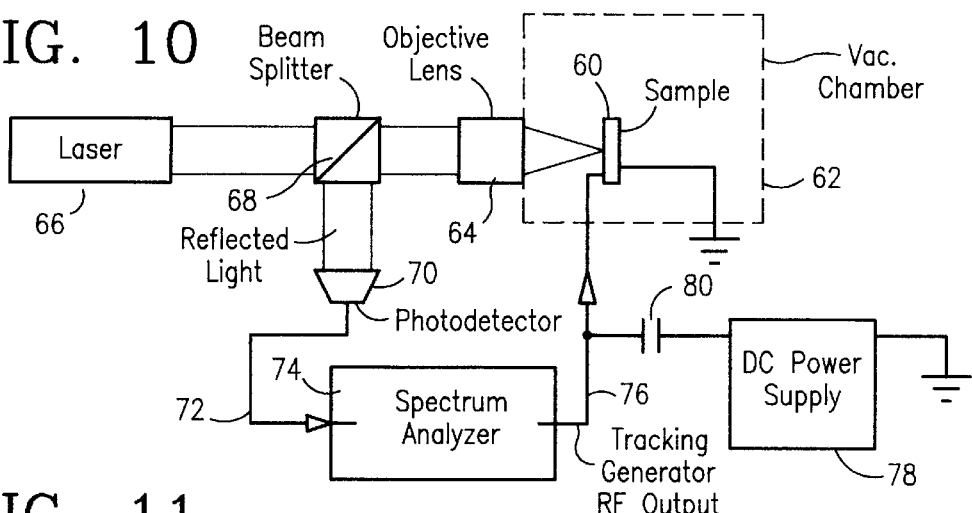
FIG. 10 is a schematic diagram of a test setup for measuring the motion of the structures of FIG. 8 or FIG. 9.

Measurement of the motion of the mesh nanostructures 32 or 50 such as those described above has been carried out using an optical interferometric technique in a test setup such as that illustrated in FIG. 10. In this example, the mesh nanostructure, or sample 60, was placed in a vacuum chamber 62 which was capable of being pumped to pressures below 1 mTorr, a pressure that is low enough that dissipation due to surrounding gasses is insignificant. The sample was situated near a quartz window in the vacuum chamber, and a 0.35NA 20× microscope objective lens 64 of a long working distance was placed outside the vacuum chamber. Light from an He—Ne laser 66 was directed through a beam splitter 68 and through the objective lens 64, and was focused on the sample 60, the objective lens producing a spot of approximately 2 micrometers in diameter. The laser light was reflected off the surface of the sample 60 and back through the microscope objective 64 to the beam splitter 68, which directed the reflected light to an AC-coupled photodetector 70 having, for example, a 500 MHz band width.

The output of the photodetector 70 was an electrical signal corresponding to variations in the amplitude of the light reflected from the sample 60, and this signal was supplied by way of line 72 to a radio frequency (rf) spectrum analyzer 74. The analyzer incorporated a tracking generator, the output of which was an AC drive supplied by way of line 76 to the nanostructure sample 60 to cause it to vibrate. The drive signal on line 76 was provided at a power level that could be set by the operator and had a frequency that was identical to the frequency that was being measured by the spectrum analyzer. A variable DC offset, or bias, voltage of less than 20 volts was added to the drive signal on line 76 from a DC supply 78 by way of a series capacitor 80. The nanostructure sample 60 was driven by the rf output drive signal from the tracking generator and by the DC bias voltage, while the underlying substrate 16 was held at ground. The application of the DC bias voltage not only makes the measurement of the nanostructure motion more sensitive, but adjustment of this variable voltage permits modification of the dynamic properties of the nanostructure, making it tunable.

As noted above, the samples being tested consisted of mesh nanostructures having a period of 315 nm, which is approximately ½ the wavelength of an He—Ne laser. The reduced mass provided by the mesh nanostructure resulted in a larger resonant frequency than could be obtained with structures composed of a solid square of the same size, and the optical response of the structures was improved.

To understand the effect of the mesh structure, it is noted that the reflectance from a Fabry-Perot interferometer is sensitive to changes in the index of refraction of the sample. A sample with subwavelength features such as provided by the mesh of the present invention can act as an effectively continuous medium that has an index of refraction different than that of a solid piece of the same material. In the present case, the resultant change in the index of refraction caused an increased slope of the reflectivity versus deflection curve for deflection values close to 0.

Figure 11:
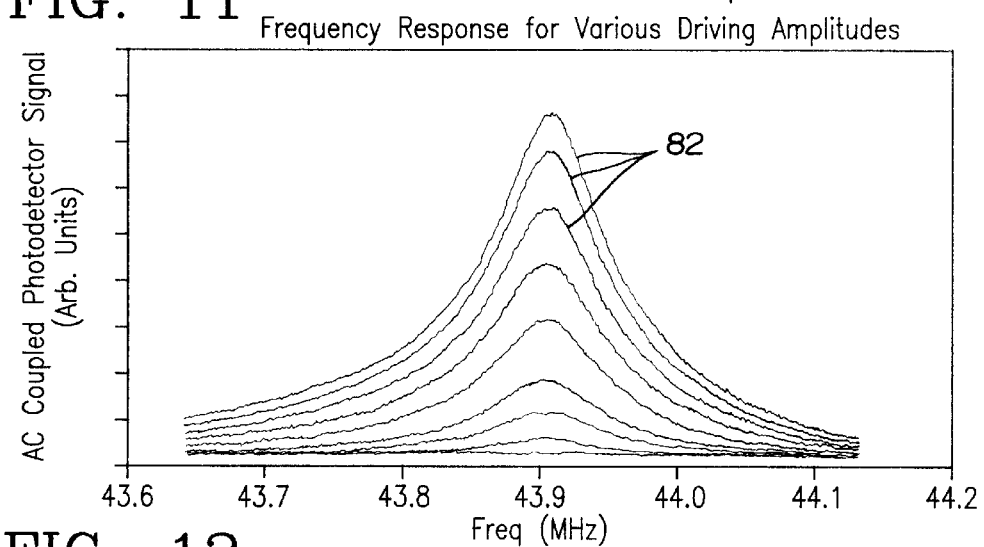
FIG. 11 is a graph illustrating the frequency dependence of an AC coupled photodetector to the light reflected from an oscillating structure such as that of FIG. 8, for amplitudes ranging from 1 to 35 mV.
Figure 12:
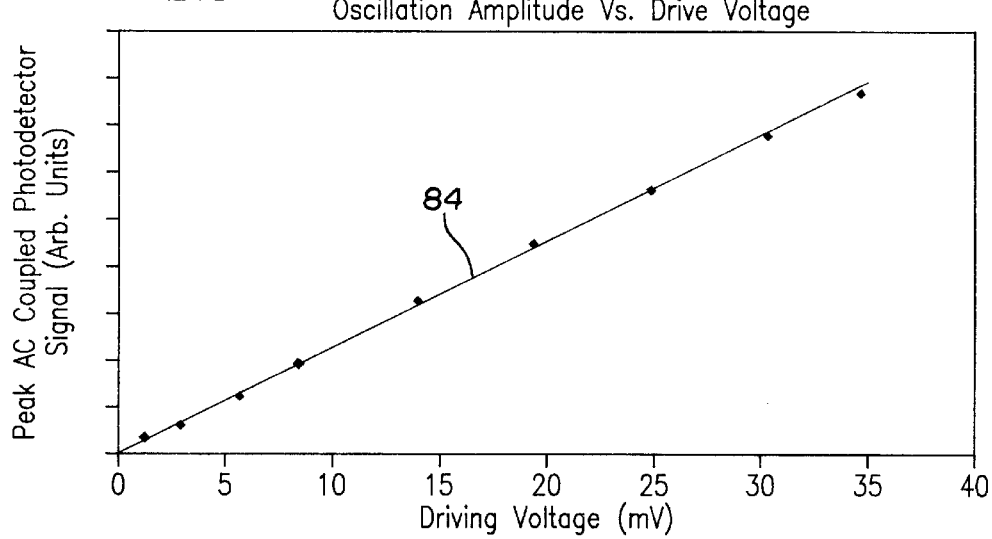
FIG. 12 is a plot of the maximum amplitudes from the graph of FIG. 11 versus the amplitude of the drive voltage.

When measurements are made in the manner described above, and the amplitude of the AC drive signal from the tracking generator of the spectrum analyzer is varied from 1 to 35 mV, resonance curves 82 for the different rf signal amplitudes are obtained, as illustrated in FIG. 11. The frequency dependence of the photodetector response to light reflected from an oscillating nanostructure such as the one illustrated in FIG. 8 is illustrated. For these measurements, the resonant frequency was approximately 44 MHz. The peak amplitudes of the vibration from FIG. 11, as measured by the photodetector 70, are plotted in FIG. 12 as a function of the amplitude of the driving signal, and the linear relationship is illustrated by the graph 84.

Figure 13:
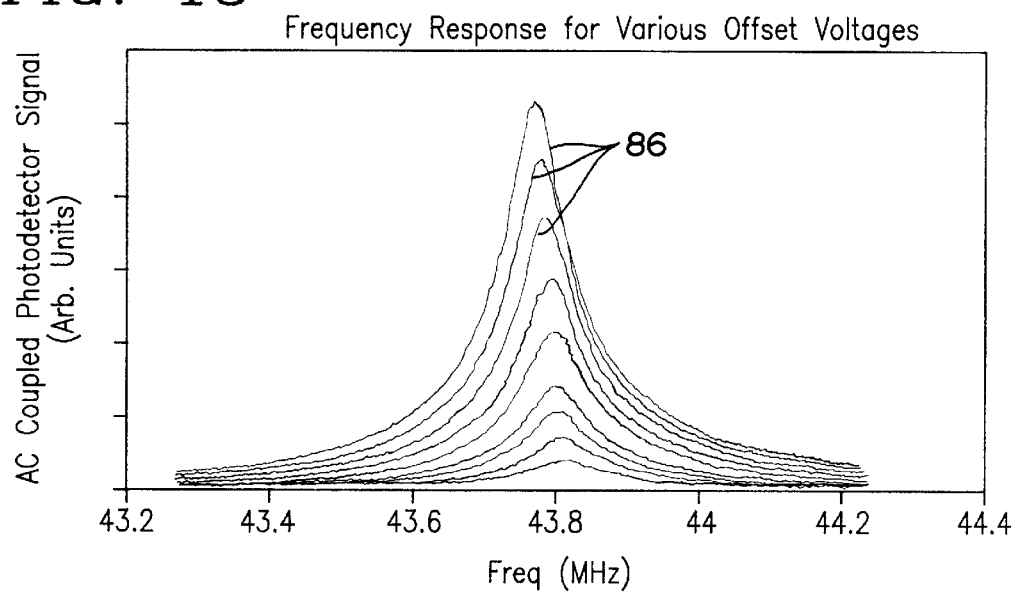
FIG. 13 is a graph similar to that of FIG. 11, in which a DC offset added to the drive voltage is held constant.
Figure 14:
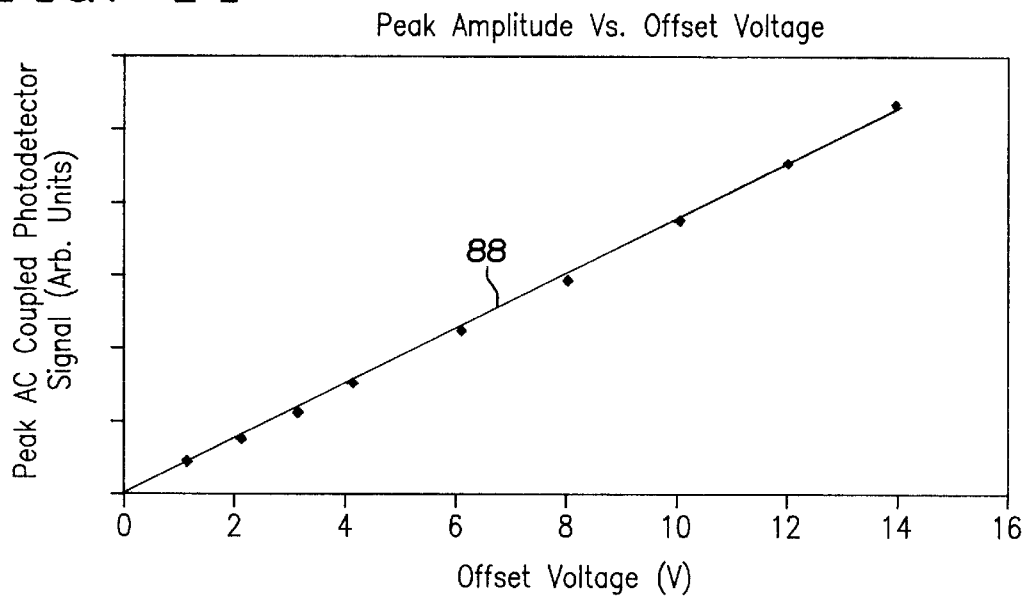
FIG. 14 is a plot of the maximum amplitudes from the graphs of FIG. 13 vs. the DC offset.

FIG. 13 illustrates several resonance curves 86 obtained as described for the to curves 82 of FIG. 11, but with the amplitude of the DC offset voltage from the power supply 78 being varied from 1 to 15 V while the rf signal is held constant. In FIG. 14, the peak amplitudes are plotted as a function of the DC offset, providing graph 88 which illustrates the linear relationship between the maximum amplitudes and the DC voltage.

In the foregoing measurements, the structures are driven at such a low mechanical amplitude that a linear relationship between the optical signal amplitudes and the magnitudes of the offset and AC voltages is clearly illustrated. Such linear relationships are expected to exist in the mechanical behavior of the structure, since the force is related to the square of the electrical potential. When that potential has a large DC offset $V_0$ and a small rf amplitude $V_1$ with frequency $\omega$, then the following relationship is obtained:

$$F(V_0+V_1 e^{i\omega t}) \ V_0^2 + V_1^2 e^{2i\omega t} + 2V_0 V_1 e^{i\omega t}$$

The signal that the spectrum analyzer reads on line 72 will depend only on the final term of the above equation, and this term is linear in the DC offset and the AC amplitude. The first term of the equation will only cause a DC deflection, and the second term, which will be very small, will be outside the measured frequencies of the spectrum analyzer. Since there is a linear relationship between the reflected optical signal and the two voltages, it follows that there is a linear relationship between the deflection and the reflectance over the range of motion that has been measured.

The Q-factor of these resonators is generally less than $10^3$. For all of the structures with a 2 micrometer mesh, a Q-factor of approximately 600 was measured. This Q-factor was affected by the layers of metal evaporated on the surface of the resonator; by eliminating surface metal, the properties of the crystal silicon itself can be measured.

Figure 15:
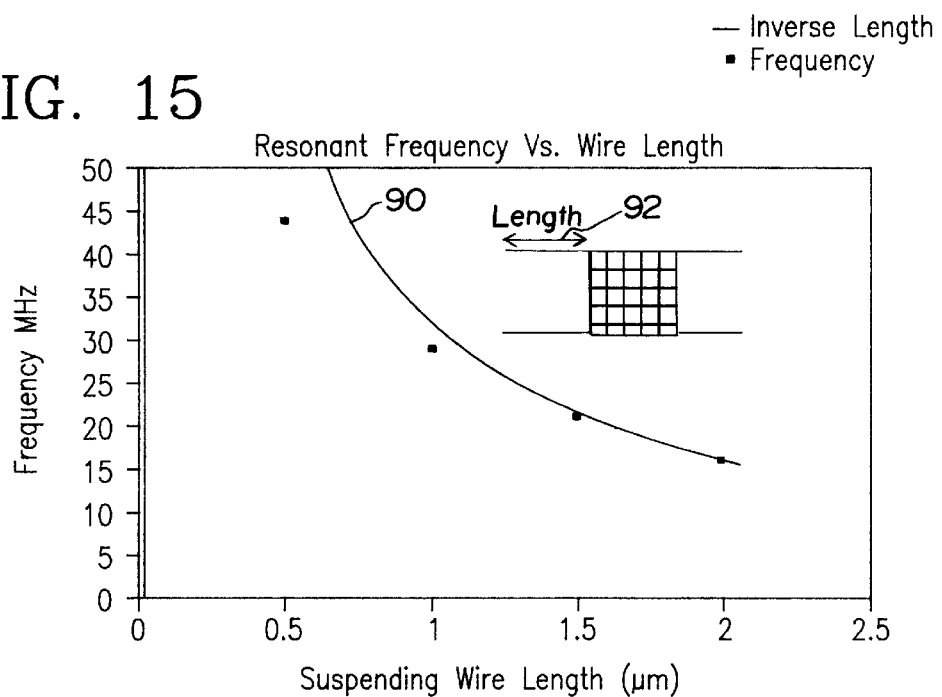
FIG. 15 is a graph of resonant frequency as a function of the length of the suspending wires for the measured structures, with the inset illustrating the length of the wire being measured.

FIG. 15 graphically illustrates the effect on the mesh resonant frequency of the length of the supporting arms for the mesh structure. The curve 90 illustrates the resonant frequency of the nanostructure as a function of the length 92 of the suspending wires for structures such as those illustrated in FIGS. 8 and 9. If the deformation of the mesh itself is neglected, then the curve would illustrate a change in frequency inverse to the length.

The measurement technique described above is useful for making measurements on nanometer scale structures which have been fabricated to have resonant frequencies of up to about 340 MHz. The resonant frequency of the nanostructure can be increased significantly by small changes in the design, but as described herein, a subwavelength mesh acts as an effectively continuous optical medium that permits interferometric measurement of vibrating structures. The mesh also provides structures with low mass and high surface area, making it useful for sensor applications. Thus, for example, when the mesh is illuminated by laser light having a wavelength greater than the spacing between adjacent beams in the mesh, small amplitude oscillations can be measured, with the detected change in optical reflection being proportional to the drive amplitude. The suboptical-wavelength features of the mesh provide a high measurement sensitivity, so that small changes in the mechanical properties of the mesh, resulting in corresponding small changes in the amplitude of the vibration, can be detected.

Figure 16:
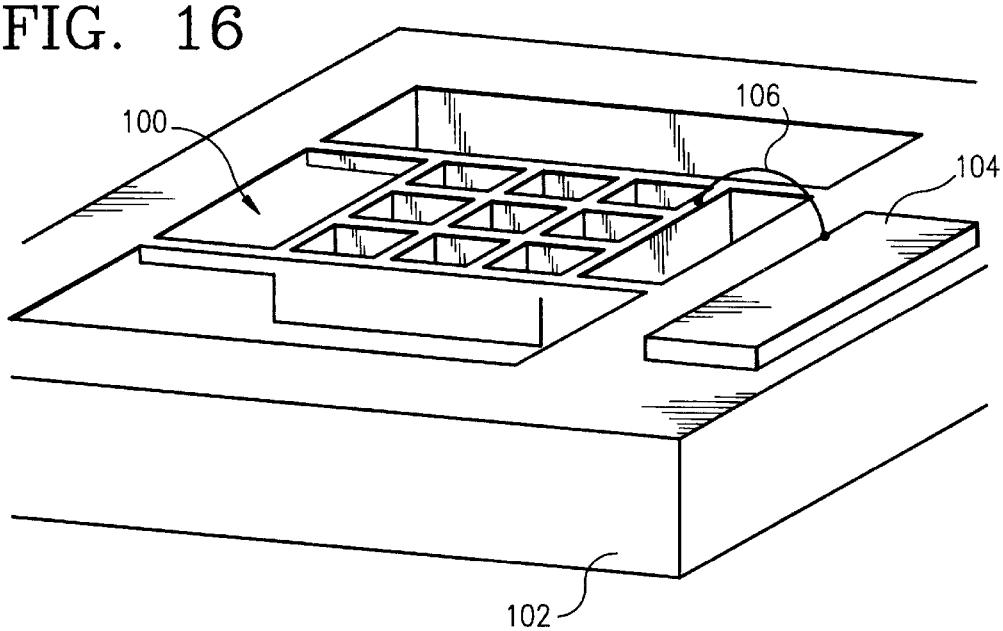
FIG. 16 is a diagrammatic illustration of a nanostructure in accordance with the invention connected to electronic circuitry fabricated in a common SOI wafer.

As diagrammatically illustrated in FIG. 16, a nanostructure mesh 100 in accordance with the present invention may be fabricated on an SOI wafer 102 as described above, where the wafer contains an electronic circuit 104 fabricated using conventional CMOS or other known processes. The circuit may incorporate, for example an rf generator and a controllable DC power supply connected to the mesh 100, as by a wire bond 106, for supplying suitable drive voltages to the mesh.

Although the invention has been described in terms of preferred embodiments, numerous modifications and variations may be made without departing from the true spirit and scope thereof as set forth in the accompanying claims. Such variations include, but are not limited to the use of chromium instead of aluminum as the metal mask, substituting the device layer material, and using other silicon-or non-silicon-based materials (such as silicon nitride or amorphous diamond, for example) to fabricate the mechanical nanostructures. In addition, the geometry of the nanostructure can take a variety of forms which will exhibit a variety of dynamic properties and modes of motion, allowing, for example, study of different aspects of the mechanical properties of the material used for fabrication.

What is claimed is:

1. A method, comprising:
    patterning and etching a silicon-on-insulator wafer to fabricate a suspended nanostructure which is electrically isolated from the wafer;
    applying an electrical connector to said nanostructure;
    applying a high frequency drive voltage to said connector on said suspended nanostructure to cause said nanostructure to vibrate;
    directing light of a predetermined wavelength onto said vibrating nanostructure;
    detecting light reflected from said vibrating nanostructure; and
    supplying the detected light to an analyzer to determine the frequency and amplitude of motion of said nanostructure.

2. The method of claim 1, wherein patterning and etching said wafer includes forming a suspended nanostructure incorporating an interferometer.

3. The method of claim 2, wherein directing light onto said nanostructure includes directing light from a laser onto said interferometer.

4. The method of claim 3, wherein applying a high frequency drive voltage includes supplying said voltage at a frequency selected to drive said nanostructure at or near its resonant frequency.

5. The method of claim 3, wherein applying a high frequency drive voltage includes supplying a radio frequency voltage between said electrical connector and said wafer to cause said nanostructure to vibrate at or near its resonant frequency.

6. The method of claim 1, wherein patterning and etching said wafer includes forming a nanostructure having a low mass, high surface area mesh suspended by thin wires for motion with respect to said wafer.

7. The method of claim 1, wherein patterning and etching said wafer includes forming a suspended nanostructure having a subwavelength mesh.

8. The method of claim 1, further including applying a DC bias voltage to said connector.

9. The method of claim 1, further including applying a variable DC bias voltage to said connector, said bias voltage being adjustable to modify the dynamic properties of said nanostructure.

10. A method of measuring the vibration of a subwavelength nanostructure, comprising:
    fabricating on a wafer a suspended, low mass, high surface area subwavelength mesh;
    causing said mesh to vibrate at or near its resonant frequency;
    directing light of a predetermined wavelength onto said mesh, whereby the vibration of said mesh produces changes in the intensity of light reflected from said mesh; and
    detecting said reflected light.

11. The method of claim 10, wherein causing said mesh to vibrate includes applying an AC voltage between said mesh and said wafer.

12. The method of claim 11, further including applying a variable DC voltage between said mesh and said wafer, said DC voltage being adjustable to vary the dynamic properties of said mesh.

13. The method of claim 10 wherein fabricating a mesh includes:
    defining a plurality of closely-spaced narrow nanostructure beams on an SOI wafer incorporating electrical components;
    etching the wafer to produce beams having a high aspect ratio to provide a low mass, high surface area mesh; and
    electrically connecting said beams to said electrical components.

14. A nanometer-scale sensor, comprising:
    a substrate;
    a nanostructure suspended for motion with respect to said substrate, said nanostructure including a mesh having a multiplicity of generally parallel, closely-spaced beams; and
    a light source for directing a beam of light of a first wavelength onto said mesh for reflection to a light detector, said beams being spaced apart by distances less than said first wavelength, whereby motion of said mesh varies the reflection of said beam.

15. The sensor of claim 14, further including means for vibrating said mesh at a resonant frequency.

16. The sensor of claim 15, wherein said parallel, spaced beams have a period of one-half the wavelength of said beam of light.

* * * * *